United States Patent
Scafidi (10) Patent No.: US 7,150,089 B2
(45) Date of Patent: Dec. 19, 2006

(54) ENHANCED HEAT TRANSFER FOR HOUSINGS

(75) Inventor: Christopher J. Scafidi, Branford, CT (US)

(73) Assignee: ADC Telecommunications, Inc., Eden Prairie, MN (US)

( * ) Notice: Subject to any disclaimer, the term of this patent is extended or adjusted under 35 U.S.C. 154(b) by 0 days.

(21) Appl. No.: 11/023,152

(22) Filed: Dec. 27, 2004

(65) Prior Publication Data

US 2005/0155210 A1   Jul. 21, 2005

Related U.S. Application Data

(62) Division of application No. 09/740,771, filed on Dec. 19, 2000, now abandoned.

(51) Int. Cl.
*B23P 11/02* (2006.01)
*H05K 9/00* (2006.01)

(52) U.S. Cl. .................. 29/463; 174/355; 174/35 GC; 174/FOR. 103; 277/920; 277/921; 277/930

(58) Field of Classification Search ........... 174/35 GC, 174/350, 355, 358, FOR. 103; 277/920, 277/921, 930; 220/4.22, 4.21, 4.24, 378, 220/806; 29/463, 888.3
See application file for complete search history.

(56) References Cited

U.S. PATENT DOCUMENTS

| | | | | |
|---|---|---|---|---|
| 2,611,506 A | * | 9/1952 | Scheer | 220/327 |
| 4,406,458 A | * | 9/1983 | Maier | 277/650 |
| 4,662,967 A | | 5/1987 | Bogan et al. | |
| 4,980,516 A | * | 12/1990 | Nakagawa | 174/35 GC |
| 5,020,201 A | * | 6/1991 | Kitamura | 29/27 C |
| 5,600,091 A | * | 2/1997 | Rose | 174/35 R |
| 5,731,541 A | * | 3/1998 | Bernd et al. | 174/35 GC |
| 5,882,729 A | * | 3/1999 | Kahl et al. | 427/265 |

OTHER PUBLICATIONS

Chomerics, a division of Parker Hannifin Corp., "Therm-A-Gap™ Interface Materials—Highly Conformable, Thermally Conductive Gap Fillers," *Technical Bulletin 70*, 6 pp. (1999).
Chomerics, a division of Parker Hannifin Corp., "CHO-SEAL 1928 Corrosion-Resistant EMI Shielding Gasket," www.chomerics.com, 1 p. (undated).
Chomerics, a division of Parker Hannifin Corp., "Conductive Elastomer Sheet Stock," www.chomerics.com, 3 pp. (undated).
Thermagon, Inc., "T-pli Series 200—Thermally Conductive Elastomer," 2 pp. (Jul. 15, 1999).
Young, "Thermal Gap Fillers: New Material Overcomes Performance Trade-Offs," *Thermal Management*, 2 pp., (undated).

* cited by examiner

*Primary Examiner*—Eric Compton
(74) *Attorney, Agent, or Firm*—Fogg and Associates LLC

(57) ABSTRACT

An apparatus that has housing for containing objects. The housing has two heat-conducting partial-boundaries having an interface between them. The apparatus also has a medium for enhancing heat transfer across the interface.

25 Claims, 7 Drawing Sheets

ENHANCED HEAT TRANSFER FOR HOUSINGS

CROSS-REFERENCE TO RELATED APPLICATIONS

This application is a divisional application of U.S. application Ser. No. 09/740,771 filed Dec. 19, 2000 now abandoned and titled "ENHANCED HEAT TRANSER FOR HOUSINGS", which is herein by reference and claimed in priority.

TECHNICAL FIELD

The present invention relates generally to the field of housings for containing electronic components and particularly to increasing the cooling of electronic components contained within housings formed by butting two partial-shells together by enhancing the heat transfer across the abutment.

BACKGROUND

Electronic components may be located in housings in many applications. For example, electronic components may be housed in housings to protect them against harsh environments, vandalism, or the like. A particular example involves using housings to protect electronic components from the weather and electromagnetic interference, such as locating various electronic components used for cable television within housings suspended from cables strung between utility poles. Other examples involve using housings to protect electronic components from harmful phenomena associated with locating electronic components underground. It is often desirable that these housings facilitate periodic servicing and/or troubleshooting. Butting two partial-shells together to form a closed shell-like housing is one method that is often used to form housings that facilitate periodic servicing and/or troubleshooting.

If electronic components generate an appreciable amount of heat, their temperatures may exceed thermal-failure limits and subsequently fail. The problem of thermal failure may be aggravated when electronic components are contained within a housing. Properly configuring the housing so that electronic-component temperatures are maintained below thermal-failure limits is one way to guard against the thermal failure of housed electronic components. Some configurations may involve constructing housings from heat conducting materials and thermally coupling the electronic components to the interior surfaces of the housing so that the heat is conducted into the housing and subsequently transferred to external environments, such as outside air. In these configurations, the heat transfer rate (cooling-rate), for a given housing material, is proportional to the amount of exterior surface area that is available for heat transfer.

In applications where it is desirable to house electronic components in housings formed by butting two partial-shells together, it may be desirable to attach electronic components to the interior of one of the partial-shells only. Unfortunately, the available heat transfer surface area is greatly reduced in these configurations. Moreover, the junction between the two-partial shells raises electromagnetic-interference and weather issues.

For the reasons stated above, and for other reasons stated below which will become apparent to those skilled in the art upon reading and understanding the present specification, there is a need in the art for housings formed by butting two partial-shells together that maintain the temperatures of heat generating electronic components contained therein below thermal failure limits and that provide adequate protection against other harmful influences.

SUMMARY

The above-mentioned problems with cooling electronic components contained within housings formed by butting two partial-shells together and other problems are addressed by embodiments of the present invention and will be understood by reading and studying the following specification. Embodiments of the present invention provide an apparatus that includes a housing for containing objects. The housing has two heat-conducting partial-boundaries having an interface between them. The apparatus has a medium for enhancing heat transfer across the interface. Enhancing the interfacial heat transfer increases the amount of exterior surface area that is available for heat transfer by making the exterior surface area of both partial boundaries available for heat transfer. Therefore, enhancing the interfacial heat transfer will increase the rate at which the objects are cooled.

More particularly, in one embodiment the heat-transfer enhancing medium is a thermally conducting material disposed between the partial-boundaries that has a conformability enabling substantially void-free contact. In another embodiment, the apparatus has an electromagnetic-interference seal that is disposed between the partial boundaries in addition to the thermally conducting material. In another embodiment, the apparatus has an electromagnetic-interference seal and a weather-seal that are disposed between the partial boundaries in addition to the thermally conducting material. In another embodiment, the thermally conducting material is weatherproof. In another embodiment, the thermally conducting material is weatherproof and weather sealing. In another embodiment, the thermally conducting material is weatherproof and weather sealing and protects against electromagnetic interference.

DETAILED DESCRIPTION

In the following detailed description, reference is made to the accompanying drawings that form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense.

The present invention addresses cooling objects contained within housings formed by butting two partial-shells together, where at least one of the objects is thermally coupled to one of the partial-shells. In such configurations, each partial-shell has a face, and the partial-shells are butted together by butting the faces together, forming an interface between the faces.

Heat is conducted from the object into the partial-shell (first partial-shell) to which it is thermally coupled. The heat is then conducted within the first partial-shell, across the interface, and into the other partial-shell (second partial-shell) that acts as a heat sink for the first partial-shell. As the heat is conducted through the first partial-shell, across the interface, and through the second partial shell, it is also convected away from the exterior surfaces of the respective shells, with the rate of heat transfer being proportional to the exterior surface area.

The heat transfer across the interface, and ultimately from the object, is proportional to the thermal contact area between the faces of the first and second partial-shells. For example, if the thermal contact area is zero, i.e., no thermal contact between the faces, substantially all of the heat is convected away from the exterior surface of the first partial-shell. In other words, the amount of exterior surface area available for heat transfer is limited to that of first partial-shell. Establishing thermal contact between the faces enables heat to be convected through exterior surface area of both partial-shells.

The entire exterior surface area of the second shell is not necessarily an effective heat transfer area, however. For example, if the thermal contact area between the faces is fairly small, thus making the thermal contact somewhat poor, the effective heat transfer area of the second partial-shell will be limited to the portion of the exterior surface area adjacent the interface, while substantially no heat is convected through remaining exterior surface area. As the thermal contact area is increased, the heat transfer across the interface, and thus from the object, increases. This increases the portion of the total exterior surface area of the second partial-shell that is effective heat transfer area. The thermal contact area between the faces can be increased by substantially eliminating the voids that form when the faces are butted together and by increasing the area of each of the faces.

Figure 1:
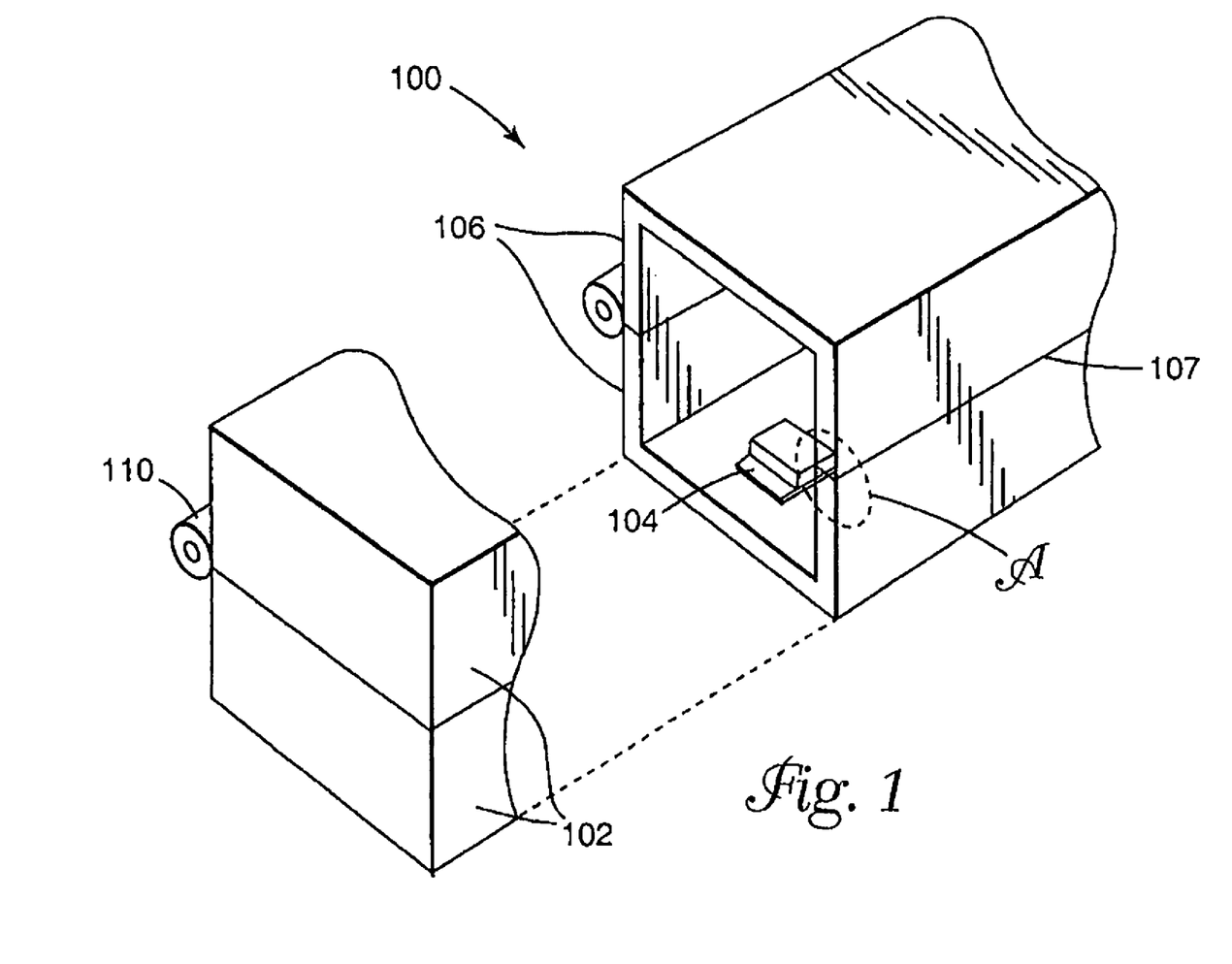
FIG. 1 is a perspective view demonstrating a first embodiment of the present invention.

Apparatus 100, shown in FIG. 1, demonstrates a first embodiment of the present invention. Apparatus 100 includes housing 102 adapted to contain at least one object 104, such as an electronic component. Housing 102 includes a pair of partial-shells 106 that are butted together to form two heat-conducting partial-boundaries having interfacial boundary 107 therebetween. As demonstrated in FIG. 1, at least one object 104 may be mounted on an interior surface of one of partial-shells 106 using a suitable method, such as screwing, brazing, bolting, or the like. Any material designed for improving thermal contact may be disposed between the objects and the partial-shell, such as T-PLI SERIES 200, manufactured by Thermagon, Inc. or THERM-A-GAP T174, manufactured by Chomerics.

Partial-shells 106 may be of any material having suitable thermal properties that is suitable for outdoor use, such as aluminum. Hinge 110 may be disposed as shown in FIG. 1 to pivotally attach shells 106 together. Partial-shells 106 may be selectively secured together using any suitable arrangement, such as cap screws, nuts and bolts, threaded studs and nuts, clamps, or the like. In one embodiment, cap screws, nuts and bolts, threaded studs and nuts, clamps, or the like may replace hinge 110.

FIGS. 2 through 5 are enlarged views of encircled region A in FIG. 1 that illustrate embodiments A1 through A4, respectively. Each of FIGS. 2 through 5 demonstrates that each of partial-shells 106 has a face 106a. Apparatus 100 addresses the issue of increasing the thermal contact area between faces 106a by substantially eliminating the voids that form when faces 106a are butted together.

Figure 2:
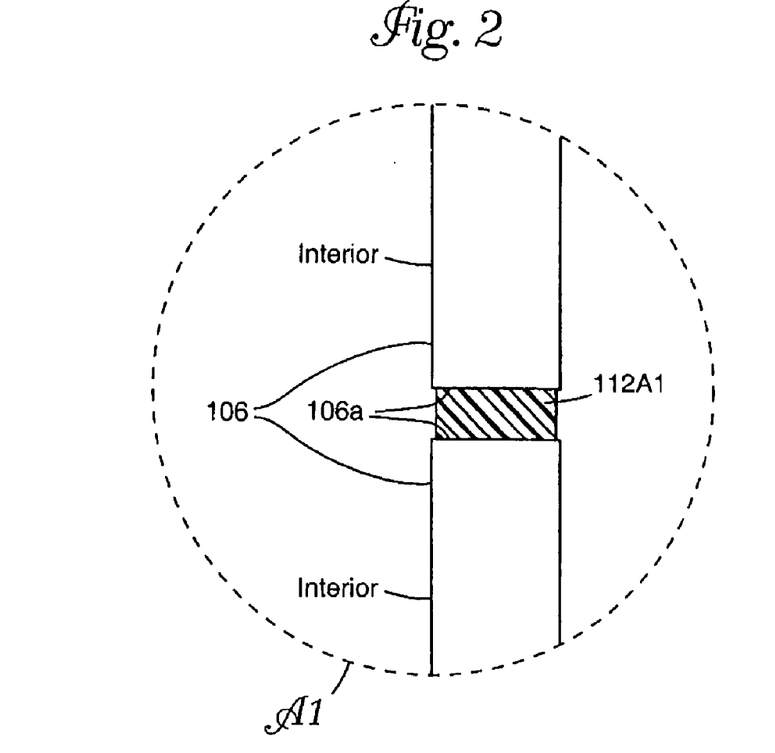
FIG. 2 is an enlarged view of region A of FIG. 1 demonstrating embodiment A1 of the present invention.

In embodiment A1, material 112A1 is sandwiched between faces 106a, as shown in FIG. 2, to substantially eliminate the voids that form when faces 106a are butted together. Material 112A1 may be of any material suitable to thermally couple partial-shells 106 together, such as an elastomer having a conformability sufficient to create substantially void-free contact between faces 106a and having suitable thermal conductivity, e.g., T-PLI SERIES 200, manufactured by Thermagon, Inc. or THERM-A-GAP T174, manufactured by Chomerics. In one embodiment, material 112A1 may also be weatherproof, such as THERM-A-GAP T174, manufactured by Chomerics. In another embodiment, material 112A1 may also be weather sealing and weatherproof, such as THERM-A-GAP T174, manufactured by Chomerics. In another embodiment, material 112A1 is a thermally and an electrically conductive weather sealing and weatherproof material that seals against electromagnetic interference and the weather.

The creation of interface 107 by butting partial-shells 106 together also gives rise to weather and electromagnetic-interference issues. Embodiments A2 through A4 each address the issue of increasing the thermal contact area between faces 106a by substantially eliminating the voids that form when faces 106a are butted together and the electromagnetic-interference and weather issues by providing for protecting the interface against electromagnetic interference and the weather.

Figure 3:
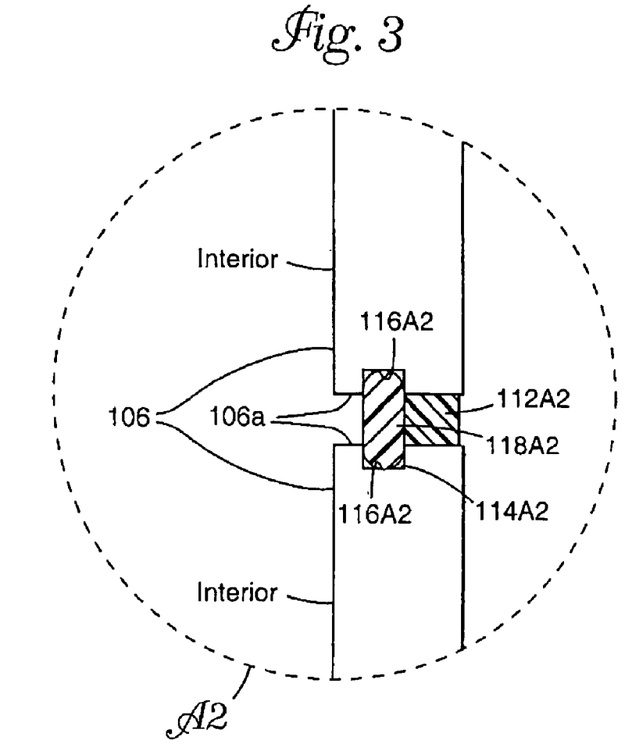
FIG. 3 is an enlarged view of region A of FIG. 1 demonstrating embodiment A2 of the present invention.

Embodiment A2 is demonstrated in FIG. 3. Material 112A2 is sandwiched between faces 106a to substantially eliminate the voids that form when faces 106a are butted together and to protect against the weather. FIG. 3 shows channel 114A2 interiorly of material 112A2 formed by groove 116A2 in each of faces 106a. Seal 118A2 is disposed within channel 114A2 to protect against electromagnetic interference. Each groove 116A2 forms a continuous loop around the perimeter of housing 102. Seal 118A2 may be any seal suitable for sealing against electromagnetic interference, such as an electrically conductive elastomer (e.g., of the types manufactured by Chomerics, Tecknit, and Instrument Specialties for electromagnetic interference shielding) adapted to be disposed within channel 114A2. Material 112A2 may be of any weatherproof, weather-sealing material suitable to thermally couple partial-shells 106 together, such as an elastomer having a conformability sufficient to create substantially void-free contact between faces 106a and having suitable thermal conductivity, e.g., THERM-A-

GAP T174, manufactured by Chomerics. Material 112A2 also protects seal 118A2 against the weather.

In one embodiment, material 112A2 is sandwiched between faces 106a interiorly and exteriorly of seal 118A2. In another embodiment, material 112A2 may be of any material suitable to thermally couple partial-shells 106 together, such as an elastomer having a conformability sufficient to create substantially void-free contact between faces 106a and having suitable thermal conductivity, and seal 118A2 may be any weatherproof, seal suitable for sealing against electromagnetic interference and the weather, such as an electrically conductive, corrosion resistant elastomer (e.g., CHO-SEAL manufactured by Chomerics) adapted to be disposed within channel 114A2. In another embodiment, material 112A2 may be weatherproof, such as THERM-A-GAP T174, manufactured by Chomerics, and seal 118A2 may be any weatherproof seal suitable for sealing against electromagnetic interference and the weather, such as an electrically conductive, corrosion resistant elastomer (e.g., CHO-SEAL manufactured by Chomerics) adapted to be disposed within channel 114A2.

Figure 4:
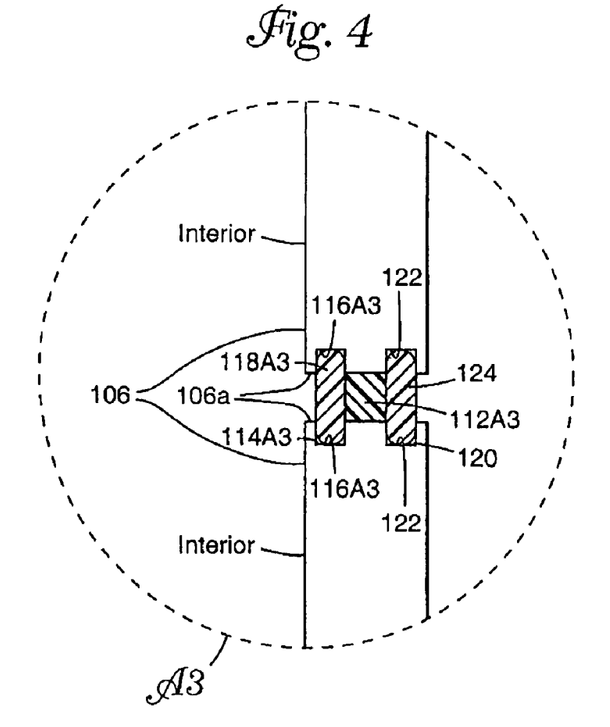
FIG. 4 is an enlarged view of region A of FIG. 1 demonstrating embodiment A3 of the present invention.

In embodiment A3, material 112A3 is sandwiched between faces 106a, as shown in FIG. 4, to substantially eliminate the voids that form when faces 106a are butted together. FIG. 4 shows channel 114A3 interiorly of material 112A3 formed by a groove 116A3 in each of faces 106a. Each of grooves 116A3 forms a continuous loop around the perimeter of housing 102. Seal 118A3 is disposed within channel 114A3 to protect against electromagnetic interference. Seal 118A3 may be any seal suitable for sealing against electromagnetic interference, such as an electrically conductive elastomer (e.g., of the types manufactured by Chomerics, Tecknit, and Instrument Specialties for electromagnetic interference shielding) adapted to be disposed within channel 114A3.

FIG. 4 shows channel 120, exteriorly of material 112A3, formed by a groove 122 in each of faces 106a. Each of grooves 122 forms a continuous loop around the perimeter of housing 102. Seal 124 is disposed within channel 120 to protect against the weather. Seal 124 may be any seal suitable for sealing the abutment against the weather, such as silicone rubber adapted to be disposed within channel 120. Material 112A3 may be of any material suitable to thermally couple partial-shells 106 together, such as an elastomer having a conformability sufficient to create substantially void-free contact between faces 106a and having suitable thermal conductivity, e.g., T-PLI SERIES 200, manufactured by Thermagon, Inc. or THERM-A-GAP T174, manufactured by Chomerics. Seal 124 also protects seal 118A3 and material 112A3 against the weather. In one embodiment, material 112A3 is sandwiched between faces 106a both interiorly and exteriorly of channel 114A3.

Figure 5:
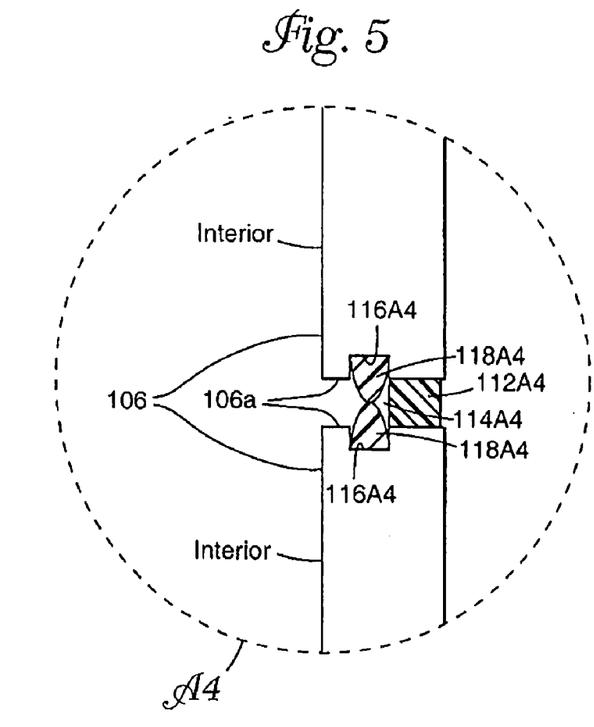
FIG. 5 is an enlarged view of region A of FIG. 1 demonstrating embodiment A4 of the present invention.

In embodiment A4, material 112A4 is sandwiched between faces 106a, as shown in FIG. 5, to substantially eliminate the voids that form when faces 106a are butted together and to protect against the weather. FIG. 5 shows channel 114A4 interiorly of material 112A4 formed by a groove 116A4 in each of faces 106a. Each of grooves 116A4 forms a continuous loop around the perimeter of housing 102. A pair of abutting seals 118A4 is disposed within channel 114A4, as shown, to protect against electromagnetic interference. Each of abutting seals 118A4 may be any seal suitable for sealing the abutment against electromagnetic interference, such as an electrically conductive elastomer (e.g., of the types manufactured by Chomerics, Tecknit, and Instrument Specialties for electromagnetic interference shielding) adapted to be disposed within channel 114A4.

Material 112A4 may be of any weatherproof, weather-sealing material suitable to thermally couple partial-shells 106, such as an elastomer having a conformability sufficient to create substantially void-free contact between faces 106a and having suitable thermal conductivity, e.g., THERM-A-GAP T174, manufactured by Chomerics. Material 112A4 also protects both of abutting seals 118A4 against the weather.

In one embodiment, each of abutting seals 118A4 may be any weatherproof seal suitable for sealing against electromagnetic interference and the weather, such as an electrically conductive, corrosion resistant elastomer (e.g., CHO-SEAL manufactured by Chomerics) adapted to be disposed within channel 114A4. In this embodiment, material 112A4 may be of any weatherproof material suitable to thermally couple partial-shells 106 together, such as an elastomer having a conformability sufficient to create substantially void-free contact between faces 106a and having a suitable thermal conductivity, e.g., THERM-A-GAP T174, manufactured by Chomerics. In another embodiment, material 112A4 is sandwiched between faces 106a exteriorly and interiorly of channel 114A4.

To manufacture the first embodiment, partial-shells 106 each having a face 106a are formed. Hinge 110 may be formed and used to pivotally attach partial-shells 106 together, as shown in FIG. 1. Partial shells 106 may be selectively secured to each other using cap screws, nuts and bolts, threaded studs and nuts, clamps or the like. In one embodiment, cap screws, nuts and bolts, threaded studs and nuts, clamps, or the like may replace hinge 110.

In embodiment A1, material 112A1 is disposed on either of faces 106a and partial-shells 106 are butted together to compress material 112A1 between faces 106a, as shown in FIG. 2. To manufacture embodiment A2, groove 116A2 is formed in each face 106a using a single tool setup. Seal 118A2 is disposed in either of grooves 116A2, and material 112A2 is disposed on either of faces 106a exteriorly of seal 118A2. Partial-shells 106 are butted together to compress material 112A2 between faces 106a and to compress seal 118A2 within channel 114A2, as shown in FIG. 3. In one embodiment, material 112A2 is disposed on either of faces 106a exteriorly and interiorly of seal 118A2, and partial-shells 106 are butted together to compress material 112A2 between faces 106a and to compress seal 118A2 within channel 114A2.

To manufacture embodiment A3, groove 116A3 is formed in each face 106a, as shown in FIG. 4, and groove 122 is formed in each in each face 106a, as shown in FIG. 4, using a single tool setup. Seal 118A3 is disposed in either of grooves 116A3; seal 124 is disposed in either of grooves 122; and material 112A3 is disposed on either of faces 106a. Partial-shells 106 are butted together to compress seal 118A3 within channel 114A3, to compress seal 124 within channel 120, and to compress material 112A3 between faces 106a, as shown in FIG. 4. In one embodiment, material 112A3 is disposed on faces 106a both interiorly and exteriorly of channel 114A3, and partial-shells 106 are butted together to compress material 112A3 between faces 106a, to compress seal 118A3 within channel 114A3, and to compress seal 124 within channel 120.

To manufacture embodiment A4, groove 116A4 is formed in each face 106a using a single tool setup. Each seal 118A4 is disposed in each groove 116A4, and material 112A4 is disposed on either of faces 106a. Partial-shells 106 are butted together to compress material 112A4 between faces 106a and to butt seals 118A4 together so that they are compressed within channel 114A4, as shown in FIG. 5. In one embodiment, material 112A4 material 112A4 is disposed on either of faces 106a exteriorly and interiorly of seals 118A4, and partial-shells 106 are butted together to compress material 112A4 between faces 106a and to butt seals 118A4 together so that they are compressed within channel 114A4.

Figure 6:
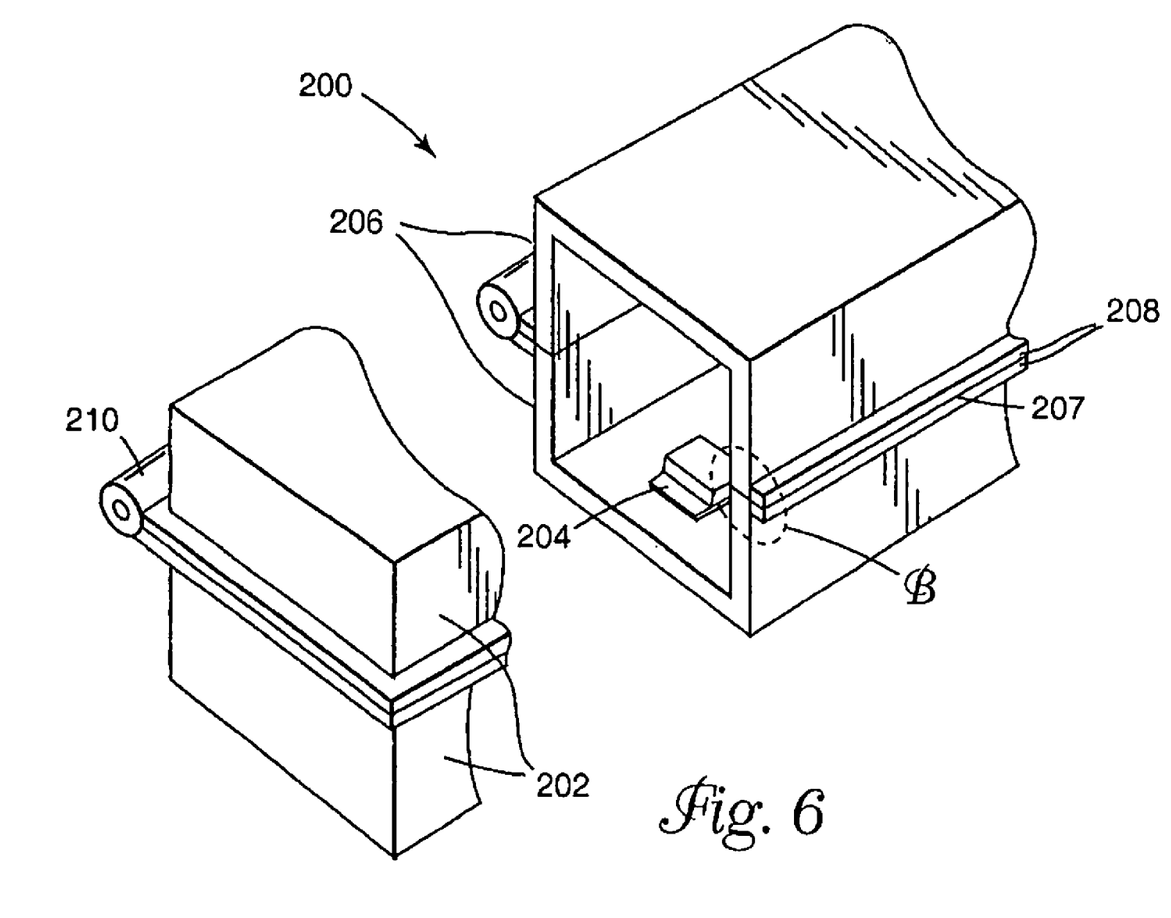
FIG. 6 is a perspective view demonstrating a second embodiment of the present invention.

Apparatus 200, shown in FIG. 6, demonstrates a second embodiment of the present invention. Apparatus 200 includes housing 202 adapted to contain at least one object 204, such as an electronic component. Housing 202 includes a pair of partial-shells 206 that are butted together to form two heat-conducting partial-boundaries. Each of partial-shells 206 has flange 208 extending around its perimeter. When partial-shells 206 and flanges 208 are butted together, interface 207 is formed therebetween and extends beyond the two heat-conducting partial-boundaries formed by partial-shells 206. As demonstrated in FIG. 6, at least one object 204 may be mounted on an interior surface of one of partial-shells 206 using a suitable method, such as screwing, brazing, bolting, or the like. Any material designed for improving thermal contact may be disposed between the objects and the partial-shell, such as T-PLI SERIES 200, manufactured by Thermagon, Inc. or THERM-A-GAP T174, manufactured by Chomerics.

Partial-shells 206 and flanges 208 may be of any material having suitable thermal properties that is suitable for outdoor use, such as aluminum. Flanges 208 may be attached to shells 206 by any suitable method, such as brazing or during casting. Hinge 210 may be disposed as shown in FIG. 6 to pivotally attach shells 206 together. Partial-shells 206 and flanges 208 may be selectively secured together using any suitable arrangement, such as cap screws, nuts and bolts, threaded studs and nuts, clamps, or the like. In one embodiment, cap screws, nuts and bolts, threaded studs and nuts, clamps, or the like may replace hinge 210.

FIGS. 7 through 11 are enlarged views of encircled region B in FIG. 6 that illustrate embodiments B1 through B5, respectively. Each of FIGS. 7 through 11 demonstrates that each of partial-shells 206 has a face 206a and that each of flanges 208 has a face 208a that is co-planer with and that extends face 206a. Apparatus 200 addresses the issue of increasing the thermal contact area between faces 206a by substantially eliminating the voids that form when faces 206a are butted together and by increasing the area of faces 206a using faces 208a of flanges 208. Flanges 208 also function as heat sinks and increase the exterior surface area.

Figure 7:
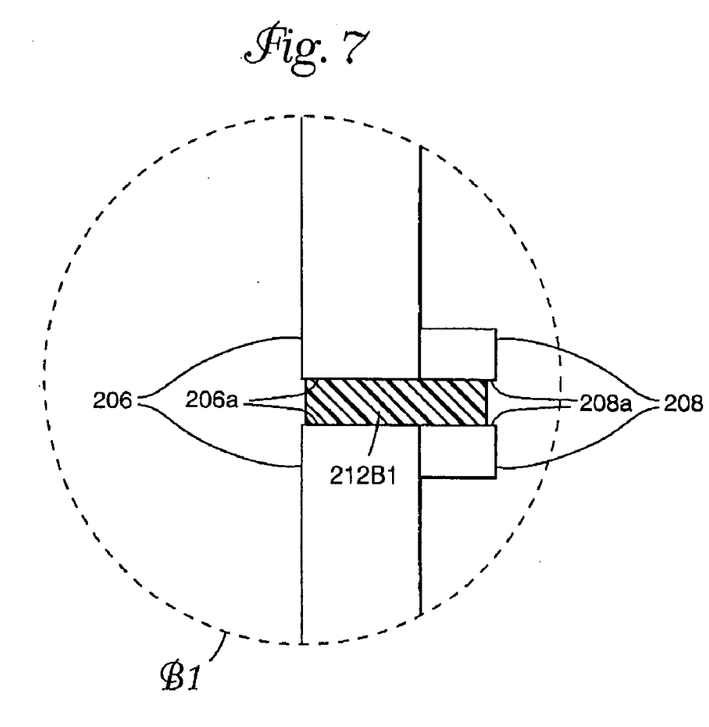
FIG. 7 is an enlarged view of region B of FIG. 6 demonstrating embodiment B1 of the present invention.

In embodiment B1, material 212B1 is sandwiched between faces 206a and between faces 208a of partial-shells 206 and flanges 208, respectively, as shown in FIG. 7. Material 212B1 may be of any material suitable to thermally couple partial-shells 206 together and flanges 208 together, such as an elastomer having a conformability sufficient to create substantially void-free contact between faces 206a and between faces 208a of partial-shells 206 and flanges 208, respectively, and having suitable thermal conductivity, e.g., T-PLI SERIES 200, manufactured by Thermagon, Inc. or THERM-A-GAP T174, manufactured by Chomerics. In one embodiment, material 212B1 may also be weatherproof, such as THERM-A-GAP T174, manufactured by Chomerics. In another embodiment material 212B1 may also be weather sealing and weatherproof, such as THERM-A-GAP T174, manufactured by Chomerics. In another embodiment, material 112B1 is a thermally and an electrically conductive weather sealing and weatherproof material that seals against electromagnetic interference and the weather.

The creation of interface 207 by butting partial-shells 206 together also gives rise to weather and electromagnetic-interference issues. Embodiments B2 through B5 each address the issue of increasing the thermal contact area between faces 106a by substantially eliminating the voids that form when faces 206a are butted together and by increasing the area of faces 206a using faces 208a of flanges 208. Embodiments B2 through B5 also each address the issues of electromagnetic interference and the weather by providing for protecting the interface against electromagnetic interference and the weather.

Figure 8:
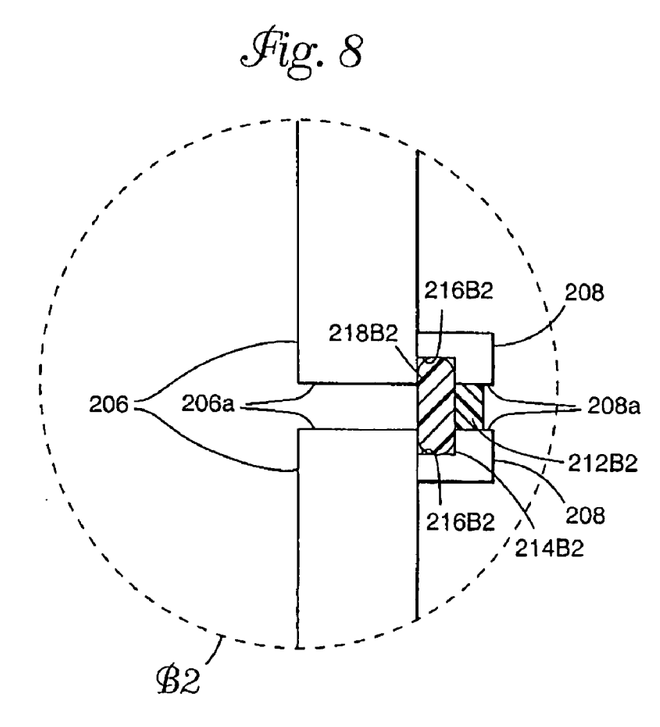
FIG. 8 is an enlarged view of region B of FIG. 6 demonstrating embodiment B2 the present invention.

Embodiment B2 is demonstrated in FIG. 8. Material 212B2 is sandwiched between faces 208a. FIG. 8 shows channel 214B2 interiorly of material 212B2 formed by groove 216B2 in each of faces 208a. Seal 218B2 is disposed within channel 214B2. Each groove 216B2 forms a continuous loop around the perimeter of housing 202. Seal 218B2 may be any seal suitable for sealing the abutment against electromagnetic interference, such as an electrically conductive elastomer (e.g., of the types manufactured by Chomerics, Tecknit, and Instrument Specialties for electromagnetic interference shielding) adapted to be disposed within channel 214B2. Material 212B2 may be of any weatherproof, weather-sealing material suitable to thermally couple flanges 208 together, such as an elastomer having a conformability sufficient to create substantially void-free contact between faces 208a and having suitable thermal conductivity, e.g., THERM-A-GAP T174, manufactured by Chomerics.

In one embodiment, material 212B2 is sandwiched between faces 206a and between faces 208a interiorly and exteriorly of seal 218B2. In another embodiment, seal 218B2 may be disposed in a channel formed by a groove in each of faces 206a. In another embodiment, material 212B2 may be of any material suitable to thermally couple partial-shells 206 and/or flanges 208 together, such as an elastomer having a conformability sufficient to create substantially void-free contact between faces 206a/and or 208a and having suitable thermal conductivity, and seal 218B2 may be any weatherproof, seal suitable for sealing against electromagnetic interference and the weather, such as an electrically conductive, corrosion resistant elastomer (e.g., CHO-SEAL manufactured by Chomerics) adapted to be disposed within channel 214B2. In another embodiment, material 212B2 may be weatherproof, such as THERM-A-GAP T174, manufactured by Chomerics, and seal 218B2 may be any weatherproof seal suitable for sealing against electromagnetic interference and the weather, such as an electrically conductive, corrosion resistant elastomer (e.g., CHO-SEAL manufactured by Chomerics) adapted to be disposed within channel 214B2.

Figure 9:
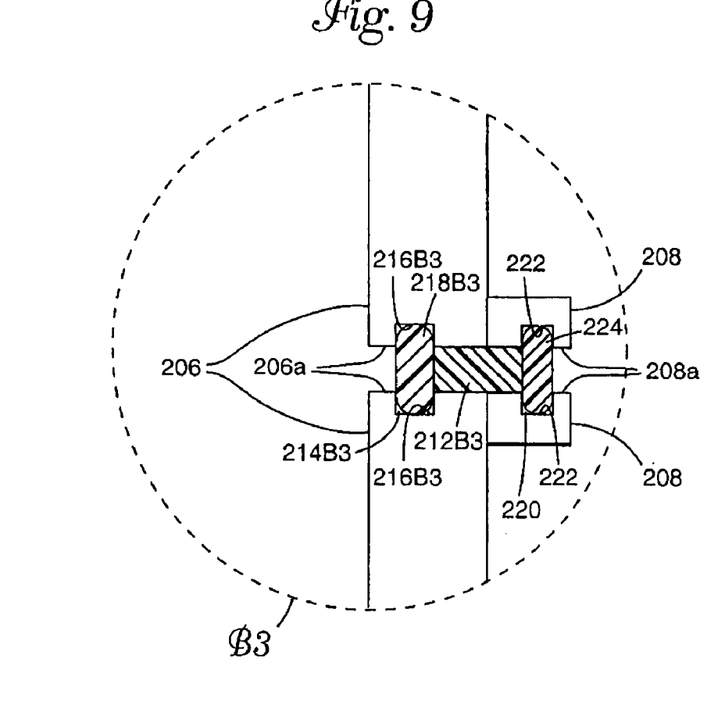
FIG. 9 is an enlarged view of region B of FIG. 6 demonstrating embodiment B3 of the present invention.

In embodiment B3, material 212B3 is sandwiched between faces 206a and between faces 208a of partial-shells 206 and flanges 208, respectively, as shown in FIG. 9. FIG. 9 shows channel 214B3 interiorly of material 212B3 formed by a groove 216B3 in each of faces 206a. Each of grooves 216B3 forms a continuous loop around the perimeter of housing 202. Seal 218B3 is disposed within channel 214B3. Seal 218B3 may be any seal suitable for sealing the abutment against electromagnetic interference, such as an electrically conductive elastomer (e.g., of the types manufactured by Chomerics, Tecknit, and Instrument Specialties for electromagnetic interference shielding) adapted to be disposed within channel 214B3.

FIG. 9 shows channel 220, exteriorly of material 212B3, formed by a groove 222 in each of faces 208a. Each of grooves 222 forms a continuous loop around the perimeter of housing 202. Seal 224 is disposed within channel 220. Seal 224 may be any seal suitable for sealing the abutment against the weather, such as silicone rubber adapted to be disposed within channel 220. Material 212B3 may be of any material suitable to thermally couple flanges 208 together, such as an elastomer having a conformability sufficient to create substantially void-free contact between faces 206a and between faces 208a and having suitable thermal conductivity, e.g., T-PLI SERIES 200, manufactured by Thermagon, Inc. or THERM-A-GAP T174, manufactured by Chomerics. In one embodiment, material 212B3 is sandwiched between faces 206a both interiorly and exteriorly of channel 214B3 and between faces 208a interiorly of channel 220. In another embodiment, seal 218B3 is disposed within a channel formed by a groove in each of faces 206a interiorly of seal 224.

Figure 10:
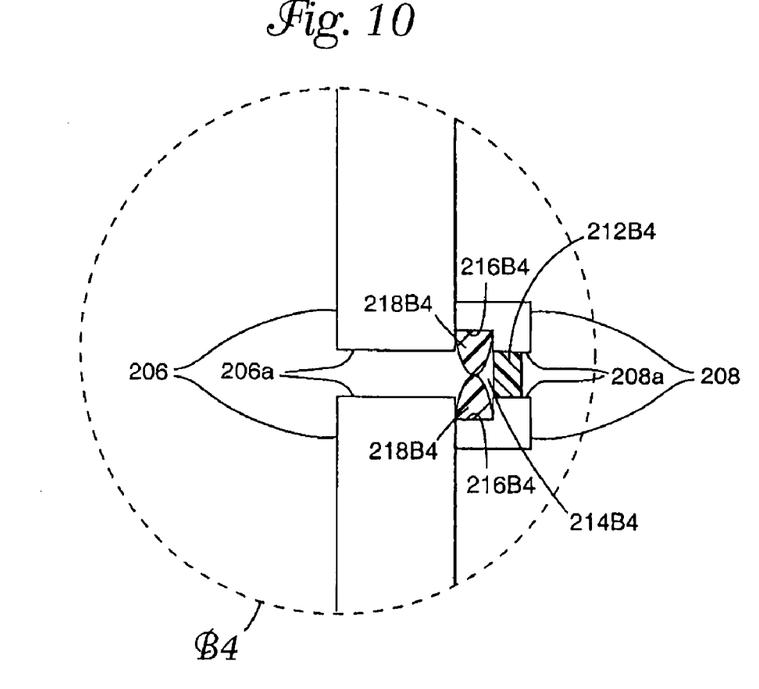
FIG. 10 is an enlarged view of region B of FIG. 6 demonstrating embodiment B4 of the present invention.

In embodiment B4, material 212B4 is sandwiched between faces 208a, as shown in FIG. 10. FIG. 10 shows channel 214B4 interiorly of material 212B4 formed by a groove 216B4 in each of faces 208a. Each of grooves 216B4 forms a continuous loop around the perimeter of housing 202. A pair of abutting seals 218B4 is disposed within channel 214B4, as shown. Each of abutting seals 218B4 may be any seal suitable for sealing the abutment against electromagnetic interference, such as an electrically conductive elastomer (e.g., of the types manufactured by Chomerics, Tecknit, and Instrument Specialties for electromagnetic interference shielding) adapted to be disposed within channel 214B4. Material 212B4 may be of any weatherproof, weather-sealing material suitable to thermally couple flanges 208 together, such as an elastomer having a conformability sufficient to create substantially void-free contact between faces 208a and having suitable thermal conductivity, e.g., THERM-A-GAP T174, manufactured by Chomerics.

In one embodiment, each of abutting seals 218B4 may be any weatherproof seal suitable for sealing the abutment against electromagnetic interference and the weather, such as an electrically conductive, corrosion resistant elastomer (e.g., CHO-SEAL manufactured by Chomerics) adapted to be disposed within channel 214B4. In this embodiment, material 212B4 may be of any weatherproof material suitable to thermally couple flanges 208 together, such as an elastomer having a conformability sufficient to create substantially void-free contact between faces 208a and having a suitable thermal conductivity, e.g., THERM-A-GAP T174, manufactured by Chomerics. In another embodiment, material 212B4 is sandwiched between faces 206a and between faces 208a interiorly and exteriorly of abutting seals 218B4. In another embodiment, abutting seals 218B4 are disposed within channel formed by a groove in each of faces 206a.

Figure 11:
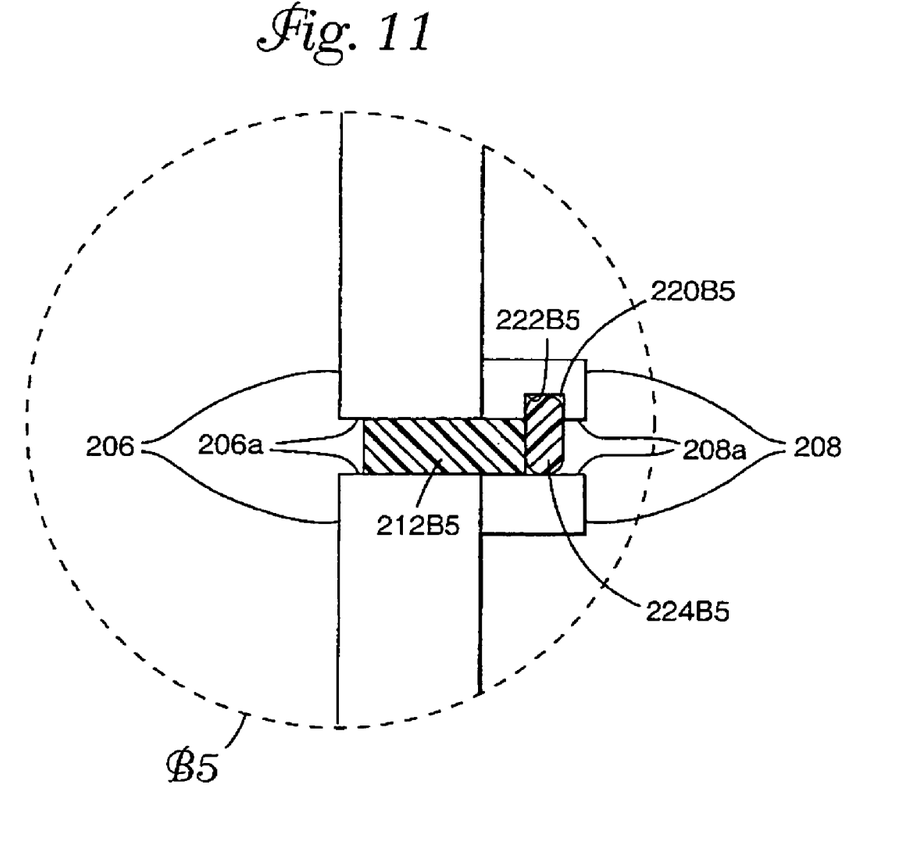
FIG. 11 is an enlarged view of region B of FIG. 6 demonstrating embodiment B5 of the present invention.

In embodiment B5, material 212B5 is sandwiched between faces 206a and between faces 208a of partial-shells 206 and flanges 208, respectively, as shown in FIG. 11. FIG. 11 shows channel 220B5, exteriorly of material 212B5, formed by groove 222B5 in one of faces 208a. Groove 222B5 forms a continuous loop around the perimeter of housing 202. Seal 224B5 is disposed within channel 220B5. Seal 224B5 may be any seal suitable for sealing the abutment against the weather, such as silicone rubber adapted to be disposed within channel 220B5. Material 212B5 may be of any material suitable to thermally couple partial-shells 206 and flanges 208 together and to seal the abutment against electromagnetic interference, such as an electrically conductive elastomer having a conformability sufficient to create substantially void-free contact between faces 206a and between faces 208a and having suitable thermal conductivity, e.g., T412, manufactured by Chomerics and QPAD3, manufactured by Bergquist.

To manufacture the second embodiment, partial-shells 206 each having a face 206a and each having a flange 208, including face 208a, around its perimeter are formed so that face 208a is co-linear with and extends face 206a. Hinge 210 may be formed and used to pivotally attach partial-shells 206 together, as shown in FIG. 6. Partial shells 206 may be selectively secured to each other using cap screws, nuts and bolts, threaded studs and nuts, clamps or the like. In one embodiment, cap screws, nuts and bolts, threaded studs and nuts, clamps, or the like may replace hinge 210.

In embodiment B1, material 212B1 is disposed on either of the abutting surfaces, i.e., face 206a and face 208a, and partial-shells 206 are butted together to compress material 212B1 between faces 206a and between faces 208a of partial-shells 206 and flanges 208, respectively, as shown in FIG. 7. To manufacture embodiment B2, groove 216B2 is formed in each flange 208 using a single tool setup. Seal 218B2 is disposed in either of grooves 216B2, and material 212B2 is disposed on either of faces 208a of flanges 208. Partial-shells 206 are butted together to compress material 212B2 between faces 208a and to compress seal 218B2 within channel 214B2, as shown in FIG. 8. In one embodiment, material 212B2 is disposed on either of the abutting surfaces, i.e., face 206a and face 208a, interiorly and exteriorly seal 218B2, and partial-shells 206 are butted together to compress material 212B2 between faces 206a and between faces 208a and to compress seal 218B2 within channel 214B2.

To manufacture embodiment B3, groove 216B3 is formed in each face 206a, as shown in FIG. 9 using a single tool setup, and groove 222 is formed in each face 208a, as shown in FIG. 9, using a single tool setup. Seal 218B3 is disposed in either of grooves 216B3; seal 224 is disposed in either of grooves 222; and material 212B3 is disposed on either of faces 208a. Partial-shells 206 are butted together to compress seal 218B3 within channel 214B3, to compress seal 224 within channel 220, and to compress material 212B3 between faces 208a, as shown in FIG. 9. In one embodiment, material 212B3 is disposed on either of faces 206a interiorly and exteriorly of channel 214B3 and on either of faces 208a interiorly of channel 220, are butted together to compress material 212B2 between faces 206a and between faces 208a, to compress seal 218B3 within channel 214B3, and to compress seal 224 within channel 220.

To manufacture embodiment B4, groove 216B4 is formed in each face 208a using a single tool setup. Each of seals 218B4 is disposed in each of grooves 216B4, and material 212B4 is disposed on either of faces 208a. Partial-shells 206 are butted together to compress material 212B4 between faces 208a and to butt seals 218B4 together so that they are compressed within channel 214B4, as shown in FIG. 10. In one embodiment, material 212B4 is disposed on either of faces 206a and on either of faces 208a interiorly and exteriorly of seals 218B4, and partial-shells 206 are butted together to compress material 212B4 between faces 206a and between faces 208a and to butt seals 218B4 together so that they are compressed within channel 214B4.

To manufacture embodiment B5, groove 222B5 is formed in one of faces 208a using a single tool setup. Seal 224B5 is disposed in groove 222B5 and material 212B5 is disposed on either of faces 206a and 208a. Partial-shells 206 are butted together to compress material 212B5 between faces 206a and 208a and to compress seal 224B5 within channel 220B5, as shown in FIG. 11.

CONCLUSION

Embodiments of the present invention have been described. The embodiments provide an apparatus that includes a housing for containing objects. The housing has two heat-conducting partial-boundaries having an interface between them. The apparatus has a medium for enhancing heat transfer across the interface.

Although specific embodiments have been illustrated and described in this specification, it will be appreciated by those of ordinary skill in the art that any arrangement that is calculated to achieve the same purpose may be substituted for the specific embodiment shown. This application is intended to cover any adaptations or variations of the present invention. For example, housing 102 may be asymmetric about interface 107, i.e., respective partial-shells 106 may have different shapes and sizes relative to each other. This may also be true for housing 202 and partial-shells 206.

What is claimed is:

1. A method for manufacturing an apparatus for containing objects, the method comprising:
    forming first and second heat-conducting partial-shells having first and second faces, respectively;
    forming first and second flanges about the perimeters of the first and second heat-conducting shells, respectively, the first and second flanges having first and second faces, respectively, wherein the first and second flange-faces are co-planer with and extend the first and second partial-shell-faces, respectively, exteriorly of the first and second partial-shells;
    forming at least one continuous groove in at least one of the first and second flange-faces around the perimeter of the first and second partial-shells;
    attaching at least one object to either the first or second partial-shell for thermal contact therebetween;
    forming a housing by butting the first and second faces and first and second flange-faces together, whereby aligning the at least one continuous groove to form at least one first continuous channel in the flange-face abutment;
    sealing the housing against electromagnetic interference with a first material selected for its electromagnetic insulating properties;
    enhancing the heat transfer between the first and second heat-conducting shells with a second material selected for its thermal conductivity; and
    sealing the housing against the weather.

2. The method of claim 1, further comprising providing for selectively securing the first and second heat conducting partial-shells together.

3. The method of claim 2, further comprising connecting the first and second partial-shells so that the first and second partial-shells pivot about a common axis.

4. The method of claim 1, wherein forming each of the at least one grooves is carried out using a single tool setup.

5. The method of claim 1, wherein sealing against electromagnetic interference is accomplished by disposing an electromagnetic-interference-seal in the at least one first channel.

6. The method of claim 1, wherein sealing against electromagnetic interference and sealing against the weather is accomplished by disposing a weatherproof, weather sealing electromagnetic-interference-seal in the at least one first channel.

7. The method of claim 1, wherein enhancing the heat transfer is carried out by disposing a weatherproof conformable thermally conducting material between the first and second flange-faces exteriorly of the at least one first channel to increase the thermal contact between the respective faces.

8. The method of claim 1, wherein enhancing the heat transfer and sealing against the weather is carried out by disposing a weatherproof, weather sealing conformable thermally conducting material between the first and second faces exteriorly of the at least one first channel to increase the thermal contact between the respective faces.

9. The method of claim 1, wherein enhancing the heat transfer is carried out by disposing a conformable thermally conducting material between the first and second partial-shell-faces and the first and second flange-faces or between the first and second partial-shell-faces or the first and second flange-faces interiorly of the at least one first channel to increase the thermal contact between the faces.

10. The method of claim 1, wherein sealing against the weather is accomplished by disposing a weather-seal in the at least one first channel.

11. The method of claim 1, further comprising forming at least one continuous second groove in the first and second partial-shell-faces around the perimeter of the first and second partial-shells, wherein when the first and second partial shells are butted together, the respective second grooves are aligned and form at least one continuous second channel in the partial-shell-face abutment.

12. The method of claim 11, wherein forming each of the at least one second grooves is carried out using a single tool setup.

13. The method of claim 11, wherein sealing against electromagnetic interference is accomplished by disposing an electromagnetic-interference-seal in the at least one second channel.

14. The method of claim 11, wherein enhancing the heat transfer is carried out by disposing a conformable thermally conducting material between the first and second partial-shell-faces and the first and second flange-faces or between the first and second partial-shell-faces or the first and second flange-faces interiorly of the at least one first channel and exteriorly of the at least one second channel to increase the thermal contact between the faces.

15. The method of claim 11, wherein enhancing the heat transfer is carried out by disposing a conformable thermally conducting material between the first and second partial-shell-faces interiorly of the second channel to increase the thermal contact between the faces.

16. The method of claim 1, further comprising forming at least one continuous second groove in the first and second flange-faces around the perimeter of the first and second partial-shells, wherein when the first and second partial shells are butted together, the respective second grooves are aligned and form at least one continuous second channel in the flange-face abutment.

17. The method of claim 16, wherein forming each of the at least one second grooves is carried out using a single tool setup.

18. The method of claim 16, wherein sealing against electromagnetic interference is accomplished by disposing an electromagnetic-interference-seal in the at least one second channel.

19. The method of claim 16, wherein enhancing the heat transfer is carried out by disposing a conformable thermally conducting material between the first and second flange-faces interiorly of the at least one first channel and exteriorly of the at least one second channel to increase the thermal contact between the faces.

20. The method of claim 16, wherein enhancing the heat transfer is carried out by disposing a conformable thermally conducting material between the first and second partial-shell-faces and the first and second flange-faces or between the first and second partial-shell-faces or the first and second flange-faces interiorly of the at least one second channel to increase the thermal contact between the faces.

21. A method for manufacturing an apparatus for containing objects, the method comprising:
   forming first and second heat-conducting partial-shells having first and second faces, respectively;
   forming first and second flanges about the perimeters of the first and second heat-conducting shells, respectively, the first and second flanges having first and second faces, respectively, wherein the first and second flange-faces are co-planer with and extend the first and second partial-shell-faces, respectively, exteriorly of the first and second partial-shells;
   forming at least one continuous groove around the perimeter of the first and second partial-shells;
   attaching at least one object to at least one of the first and second partial-shell for thermal contact therebetween;
   forming a housing by butting the first and second faces and first and second flange-faces together, whereby aligning the at least one groove to form at least one continuous channel;
   sealing the housing against electromagnetic interference with a first material selected for its electromagnetic insulating properties;
   disposing a second conformable thermally conducting material between at least one of the first and second partial-shell-faces, and the first and second flange-faces to increase the thermal contact between the faces; and
   sealing the housing against the weather.

22. A method for manufacturing an apparatus for containing objects, the method comprising:
   forming first and second heat-conducting partial-shells having first and second faces, respectively;
   forming first and second flanges having first and second faces, respectively, about the perimeters of the first and second heat-conducting shells, respectively, wherein the first and second flange-faces are co-planer with and exteriorly extend the first and second partial-shell-faces, respectively;
   forming a continuous groove in each of the first and second flange-faces and the first and second partial-shell-faces around the perimeter of the first and second partial-shells;
   attaching at least one object to at least one of the first and second partial-shell for thermal contact therebetween;
   forming a housing by butting the first and second faces and first and second flange-faces together, whereby aligning the respective grooves to form a first continuous channel in the flange-face abutment and a second continuous channel in the partial-shell-face abutment;
   inserting a first seal suitable for sealing against electromagnetic interference into the second continuous channel;
   inserting a thermally conductive material between the first and second continuous channels to make thermal contact with the first and second flange-faces and the first and second partial-shell-faces; and
   inserting a second seal suitable for sealing against weather into the first continuous channel.

23. The method of claim 22, further comprising providing for selectively securing the first and second heat conducting partial-shells together.

24. The method of claim 22, further comprising connecting the first and second partial-shells so that the first and second partial-shells pivot about a common axis.

25. The method of claim 22, wherein forming each of the continuous grooves is carried out using a single tool setup.

* * * * *